(12) United States Patent
Yusa et al.

(10) Patent No.: US 6,266,626 B1
(45) Date of Patent: Jul. 24, 2001

(54) ROM DATA VERIFICATION CIRCUIT

(75) Inventors: Terukazu Yusa; Michiaki Kuroiwa; Koji Hirate, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/222,873

(22) Filed: Dec. 30, 1998

(30) Foreign Application Priority Data

Jul. 3, 1998 (JP) .................................................. 10-189409

(51) Int. Cl.[7] ...................................................... G11C 7/00
(52) U.S. Cl. ........................ 702/117; 365/189.12; 714/718
(58) Field of Search ......................... 702/117; 365/189.05, 365/189.12, 230.01; 714/42, 718, 719, 743, 736

(56) References Cited

U.S. PATENT DOCUMENTS 4,317,200 * 2/1982 Wakatsuki et al. ................... 714/736
4,433,412 * 2/1984 Best et al. ............................. 714/736
5,664,094 * 9/1997 Taniwa et al. ......................... 714/42

FOREIGN PATENT DOCUMENTS 63-54654    3/1988   (JP) .

* cited by examiner

Primary Examiner—Kamini Shah
Assistant Examiner—Hien Vo
(74) Attorney, Agent, or Firm—Burns, Doane, Swecker & Mathis, LLP

(57) ABSTRACT

A ROM data verification circuit has a DMAC (2) for reading out data stored in the ROM (1) when a CPU (3) abandons to use an address bus (5) and a data bus (6), for dividing the data read into a plurality of divided data, and for outputting the divided data into a plurality of output ports (4) designated by addresses generated by the DMAC (2).

10 Claims, 6 Drawing Sheets

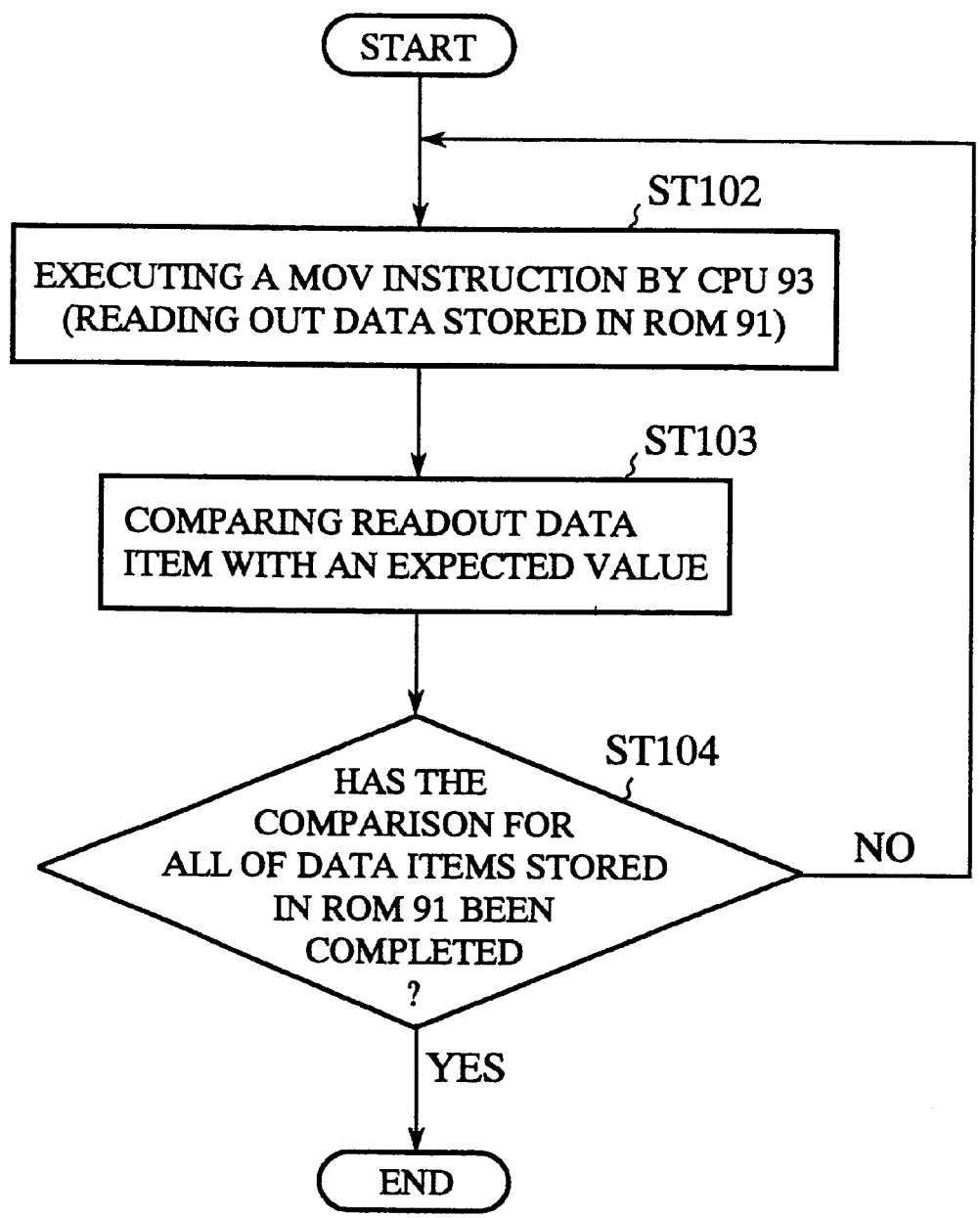

ROM DATA VERIFICATION CIRCUIT

BACKGROUND OF THE INVENTION

1. Field of the Invention

The present invention relates to a read only memory (ROM) data verification circuit for checking whether or not data have correctly been written into a ROM device (or a ROM) or into a plurality of ROM devices (or a plurality of ROMs).

2. Description of the Prior Art

FIG. 9 is a block diagram showing a configuration of a conventional ROM data verification circuit. In FIG. 9, the reference number 91 designates a Read Only Memory (ROM) for storing programs and data items, the reference number 94 denotes output ports through which addresses from a Central Processing Unit (CPU) and data items from the ROM 91 are output externally, and the reference number 93 indicates the CPU for controlling the operation of the ROM 91 and the output ports 4.

Next, a description will be given of the operation of the conventional ROM data verification circuit.

FIG. 10 is a flow chart showing the operation of the conventional ROM data verification circuit shown in FIG. 9.

In order to check whether data such as programs, control data, and other types of data have correctly been written into the ROM 91, the conventional ROM data verification circuit performs the following test.

First, the CPU 93 in the conventional ROM data verification circuit executes an instruction "MOV" as one of instructions described in a test program, so that data written and stored in the ROM 91 are read out per byte. Then, the data that have been read out are output to external devices (not shown) through the output ports 94 (Step ST102). Next, the data read out are compared with expected data that have been prepared in advance (Step ST103). Based on the comparison result obtained by the step ST103, it is possible to verify whether the data have correctly been written into the ROM 91. The completion of the comparison operation for all of data items stored in the ROM 91 (Step ST104) leads the completion of the test operation.

Since the conventional ROM data verification circuit has the configuration described above, the data size that are read out from the ROM 91 at once is small, so that it takes a long time period to perform the test operation for the data stored in the ROM 91. Recently, the memory size (or the volume) of ROM devices is increasing and the amount of data to be stored in the ROM devices is also increasing. This causes to increase the time period of the test operation to be required for checking whether or not data have correctly been stored into ROM devices. In addition, the size of test programs and test vectors to be used for testing data stored in the ROM devices are increased. This also causes to increase the time period of the test operation.

SUMMARY OF THE INVENTION

Accordingly, an object of the present invention is, with due consideration to the drawbacks of the conventional technique, to provide a ROM data verification circuit for precisely checking whether data have correctly been written into a ROM or a plurality of ROMs at a high speed rate. In addition, another object of the present invention is to provide a ROM data verification circuit for reducing the number of test vectors and a time period of test operation by using a test program in a smaller size.

In accordance with a preferred embodiment of the present invention, a ROM data verification circuit to be used for checking data stored in a ROM, comprises control means for directly reading out data stored in the ROM when a CPU abandons to use an address bus and a data bus, for dividing the data that have been read out from the ROM into a plurality of divided data, and for generating a plurality of addresses according to which the plurality of divided data are transferred, and a plurality of output ports indicated by the addresses generated by and transferred from the control means to which the plurality of divided data are transferred by the control means according to the addresses.

The ROM data verification circuit as another preferred embodiment according to the present invention, further comprises a first register to which control data indicating to abandon the use of the address bus and the the data bus by the CPU are set, wherein the control means is a Direct Memory Access Controller, and the DMAC commences to read the data stored in the ROM when the control data are stored into the first register.

The ROM data verification circuit as another preferred embodiment according to the present invention, further comprises an address pointer for generating addresses corresponding to the plurality of output ports, wherein the control means is a Direct Memory Access Controller, and the divided data outputted from the DAMC are transferred to each of the plurality of output ports designated by the corresponding address generated by the address pointer.

In the ROM data verification circuit as another preferred embodiment according to the present invention, The ROM data verification circuit as another preferred embodiment according to the present invention, the control means comprises first control means, second control means, a second register placed between the first control means and the second control means, and a Direct Memory Access Controller (DMAC) synchronous circuit, and wherein under control of the DMAC synchronous circuit, operation of both the first control means and the second control means is synchronized, the first control means reads out the data stored in the ROM and stores the data into the second register, and the second control means reads and then divides the data stored in the second register into a plurality of divided data and generates addresses to indicate the plurality of output ports and outputs the plurality of divided data to the plurality of output ports indicated by the addresses generated by the second control means.

In the ROM data verification circuit as another preferred embodiment according to the present invention, the control means is a dedicated address counter, and the ROM comprises a plurality of ROM devices, and the ROM data verification circuit further comprises dedicated address buses and dedicated data buses, placed corresponding to the output ports, through which the data read from the plurality of ROM devices are transferred to the plurality of output ports, and wherein the dedicated address counter generates the addresses to indicate the data stored in the plurality of ROM devices and outputs the addresses to the ROM devices through the dedicated address buses, and reads the data from the plurality of ROM devices and then transfers the data that have been read out into the plurality of corresponding output ports.

In the ROM data verification circuit as another preferred embodiment according to the present invention, the ROM comprises a plurality of ROM devices, the control means is a Central Processing Unit including a program counter, and the ROM data verification circuit further comprises dedicated address buses and dedicated data buses, placed corresponding to the plurality of output ports, through which the data read from the plurality of ROM devices are transferred to the plurality of output ports, and wherein the program counter in the CPU generates addressed to indicate the data stored in the plurality of ROM devices, outputs the addresses to the plurality of ROM devices through the dedicated address buses and reads the data and outputs the data that have been read out to the plurality of output ports through the dedicated data buses.

In the ROM data verification circuit as another preferred embodiment according to the present invention, the dedicated address counter simultaneously generates a plurality of addresses to indicate data stored in the plurality of ROM devices, and simultaneously reads the data from the plurality of ROM devices by using the plurality of addresses generated, and outputs the data to the plurality of corresponding output ports through the dedicated data buses.

In the ROM data verification circuit as another preferred embodiment according to the present invention, the control means is an address interpolation pointer for generating addresses to indicate data stored in the ROM, wherein when inputting an address to indicate the data stored in the ROM, the address interpolation pointer sequentially generates addresses to indicate the data stored in the ROM, transfers the addresses generated to the ROM, reads the data from the ROM, and then outputs the data that have been read out to the plurality of output ports.

As another preferred embodiment according to the present invention, a ROM data verification circuit comprises a first register for storing data read out from a ROM by using designated addresses, a second register for storing data that have been read out from the ROM in a previous readout operation, and an Arithmetic Logic Unit for performing an arithmetic operation between the data stored in both the first register and the second register and generates a check sum between the data.

The ROM data verification circuit as another preferred embodiment according to the present invention, includes instructions as micro codes. In the ROM data verification circuit, the instructions include an instruction to access both the register, the second register, and the Arithmetic Logic Unit, and to generate the check sum between the data stored in both the first register and the second register by executing the Arithmetic Logic Unit.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 10 is a flow chart showing operation of the conventional ROM data verification circuit shown in FIG. 9.

DESCRIPTION OF THE PREFERRED EMBODIMENTS

Figure 1:
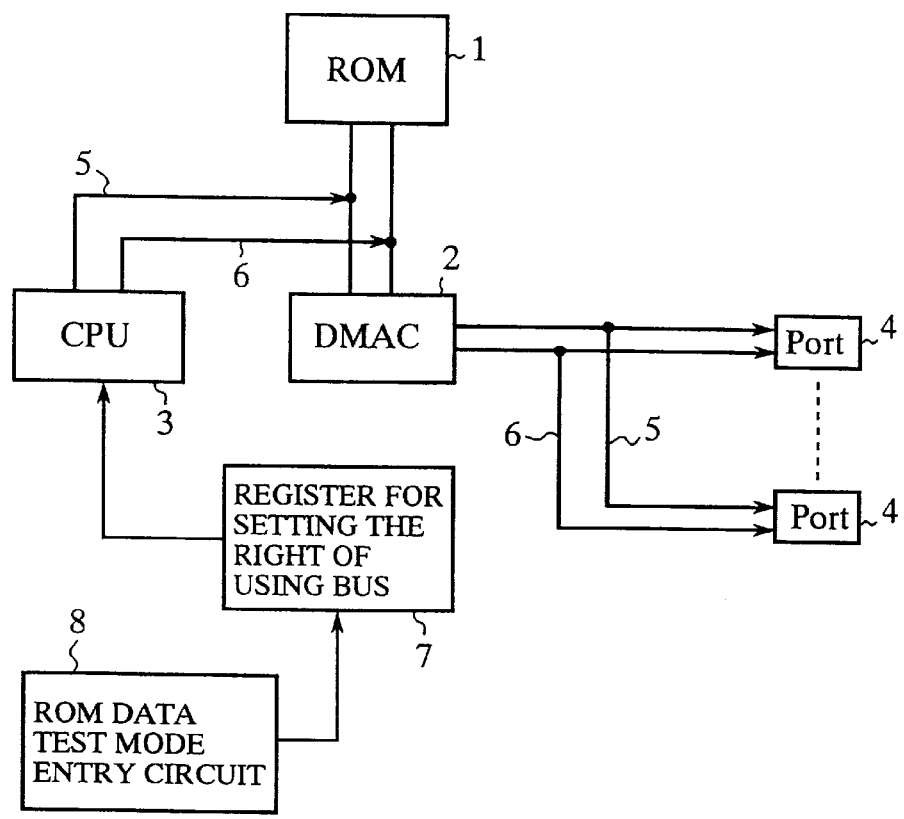
FIG. 1 is a block diagram showing a configuration of the ROM data verification circuit as the first embodiment according to the present invention.

Other features of this invention will become apparent through the following description of preferred embodiments which are given for illustration of the invention and are not intended to be limiting thereof.
First embodiment FIG. 1 is a block diagram showing a configuration of the ROM data verification circuit as the first embodiment according to the present invention. In FIG. 1, the reference number 1 designates a read only memory (ROM) for storing programs and data, the reference number 2 denotes a direct memory access controller (DMAC) as control means, the reference number 4 indicates output ports through which addresses and data are output to external devices (omitted from FIG. 1), and the reference number 3 designates a central processing unit (CPU) to control the operation of the output ports 4 and the like. The reference number 5 denotes a general purpose address bus (or an address bus), and the reference number 6 indicates a general purpose data bus (or a data bus). The reference number 7 designates a register to which data indicating the right of use of both the address bus 5 and the data bus 6 is set by the DMAC 2, not by the CPU 3. The register 7 stores the data from the DMAC 2. The reference number 8 denotes a ROM data test mode entry circuit for setting control data into the register 7 in order to halt any accesses of the CPU 3 to both the address bus 5 and the data bus 6.

The ROM data verification circuit according to the first embodiment has the resister 7 to which control data in order to halt the use of both the address bus 5 and the data bus 6 by the CPU 3 is stored. Thereby, the DMAC 2 can preferentially use both the address bus 5 and the data bus 6, so that a higher data transfer operation from the ROM 1 to external devices through the output ports 4 can be achieved during a ROM data test operation mode. In this case, the data that have been read out are divided into several divided data corresponding to the ports 4.

Next, a description will be given of the operation of the ROM data verification circuit of the first embodiment.

When the test (as data verification test) to check whether data have correctly been written into the ROM 1 is performed by comparing the data read out from the ROM 1 with expected values that have previously been prepared, first, the ROM data test mode entry circuit 8 sets to the register 7 control data indicating to abandon the right of use of both the address bus 5 and the data bus 6 by the CPU 3. Thereby, the CPU 3 enters the state where the CPU 3 can not use the address bus 5 and the data bus 6, and the DMAC 2 can preferentially use the address bus 5 and the data bus 6.

Subsequently, the DMAC 2 generates an address indicating memory areas in which 32 bit data or 64 bit data are stored, transfers the address to the ROM 2, reads the data corresponding to the address from the ROM 2, and outputs addresses designating the output ports 4. In addition to this, the DMAC 2 divides the data from the ROM 3 into divided data, each divided consisting of same predetermined bits, for example, 4 bits. Thereby, each 4-bit divided data is output to external device through the corresponding output port 4 designated by the address.

In the above configuration of the ROM data verification circuit according to the first embodiment described above, the ROM data test mode entry circuit 8 sets the control data into the register 7, but, the present invention is not limited by this configuration, for example, it is acceptable to have a configuration in which the DMAC 2 has the function of the ROM data test mode entry circuit 8 and sets the control data into the register 7.

As described above, according to the first embodiment, because the ROM data verification circuit incorporates the register 7 and the ROM data test mode entry circuit 8 or the DMAC 2 sets into the register 7 the control data indicating to abandon the tight to use both the address and data buses 5 and 6, and because the DMAC 2 directly reads out data stored in the ROM 1, divides the data, and outputs the divided data to external devices through the corresponding output ports 4, it is therefore possible to preciously execute the ROM data test operation for the data that have been written into the ROM 1 at a higher speed rate. In addition to this feature, when comparing with the case where the CPU 3 executes instructions in order to read out data stored in the ROM 1, it is possible to reduce the size of the test program.

Second embodiment

Figure 2:
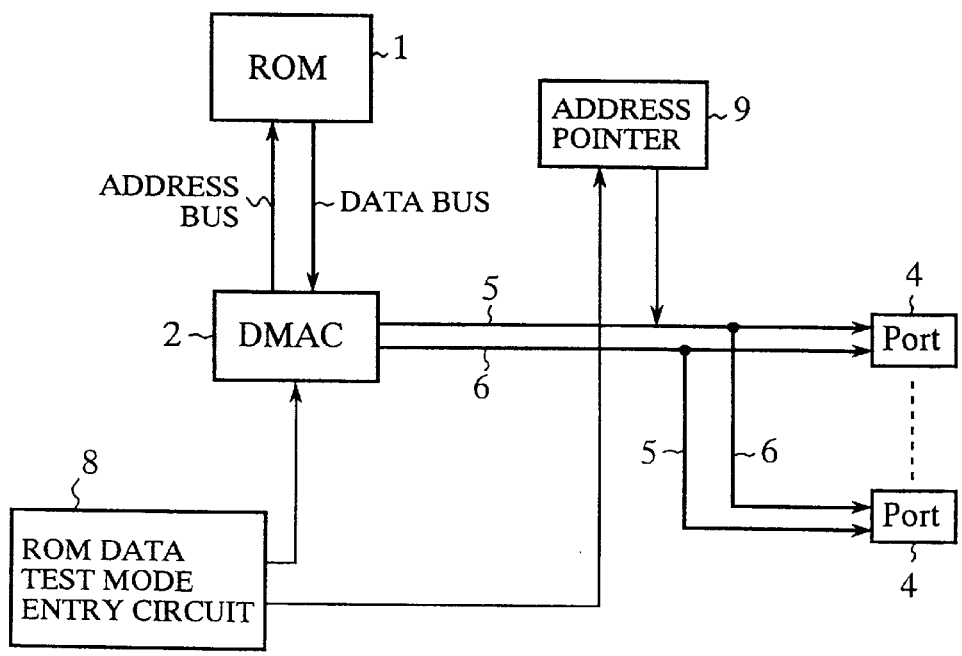
FIG. 2 is a block diagram showing a configuration of the ROM data verification circuit as the second embodiment according to the present invention.

FIG. 2 is a block diagram showing a configuration of the ROM data verification circuit as the second embodiment according to the present invention. In FIG. 2, the reference number 9 designates an address pointer for outputting addresses for indicating output ports 4 to the address bus 5. Other components in the ROM data verification circuit of the second embodiment shown in FIG. 2 are the same of those of the ROM data verification circuit of the first embodiment shown in FIG. 1, and the same reference numbers are used, and the explanation of them is therefore omitted here for brevity.

Next, a description will be given of the operation of the ROM data verification circuit of the second embodiment.

When the test (as data verification test) to check whether data have correctly been written into the ROM 1 is performed by comparing the data read out from the ROM 1 with expected values that have previously been prepared, first, the ROM data test mode entry circuit 8 sets to the register 7 a control data item indicating to abandon the right of use of the address bus 5 and the data bus 6 by the CPU 3. Thereby, the CPU 3 enters the state where the CPU 3 can not use the address bus 5 and the data bus 6, and the DMAC 2 can preferentially use the address bus 5 and the data bus 6.

Next, the ROM data test mode entry circuit 8 sets an initial value of the address to indicate each output port 4 into the address pointer 9. Subsequently, the DMAC 2 outputs the address to the ROM 1 in order to read out 32 bit data or 64 bit data corresponding to the width of the data bus 6 from the ROM 1. The address pointer 9 counts up the initial data set by the ROM data test mode entry circuit 8 to generate each address corresponding to each output port 4 and then outputs the addresses generated to the address bus 5. Thereby, the data read out from the ROM 1, for example, are transferred per 4-bit data to each of the output ports 4 indicated by the addresses generated by the address pointer 9.

In the configuration of the ROM data verification circuit according to the second embodiment described above, the ROM data test mode entry circuit 8 sets the control data into the register 7 and also sets the initial value of the address for the output ports 4 into the address pointer 9, but, the present invention is not limited by this configuration, for example, it is acceptable to have a configuration in which the DAMC 2 has the function of the ROM data test mode entry circuit 8 and sets the control data and the initial value into the register 7 and the address pointer 9, respectively.

As described above, according to the second embodiment, because the ROM data verification circuit incorporates the address pointer 9 and the register 7, and because the ROM data test mode entry circuit 8 or the DMAC 2 sets into the register 7 the control data indicating to abandon the right to use both the address and data buses 5 and 6, and also sets the initial value of the addresses for the output ports 4 into the address pointer 9, and because the DMAC 2 directly reads out data from the ROM 1, divides the data read, and outputs the divided data groups to external devices through the output ports 4 simultaneously, and because those output data may be compared with expected data simultaneously, it is therefore possible to preciously execute the test operation for the data that have been written to the ROM 1 at a higher speed rate. In addition to this feature, when comparing with the case where the CPU 3 executes instructions in order to read out data stored in the ROM 1, it is possible to reduce the size of the test program.

Third embodiment

Figure 3:
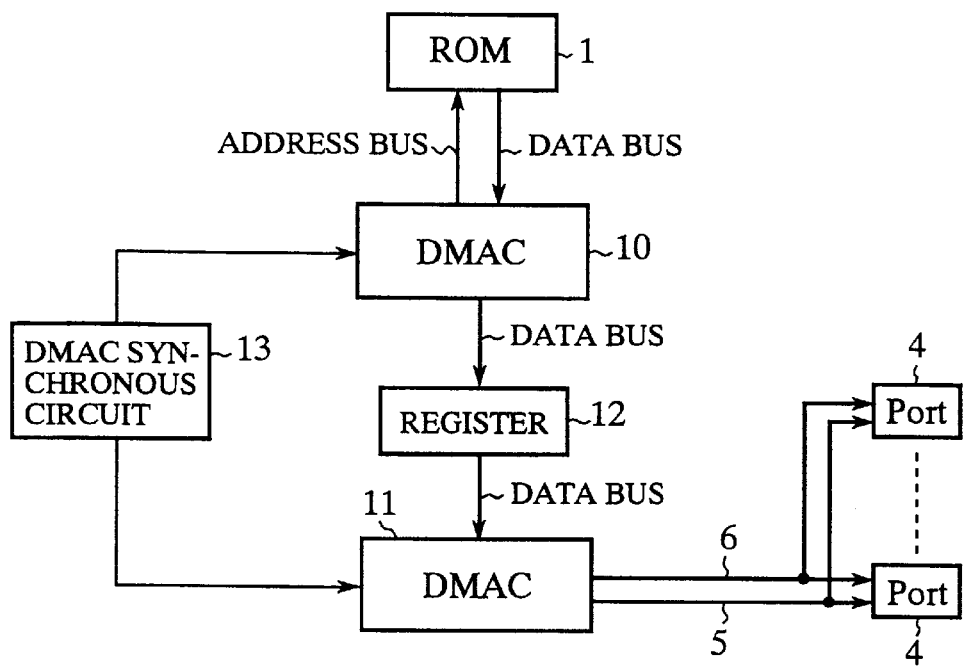
FIG. 3 is a block diagram showing a configuration of the ROM data verification circuit as the third embodiment according to the present invention.

FIG. 3 is a block diagram showing a configuration of the ROM data verification circuit as the third embodiment according to the present invention. In FIG. 3, the reference numbers 10 and 11 designate simple Direct Memory Access Controllers (DMAC) with a simple configuration and a simple function. That is, the function of each of the DMAC 10 and the DMAC 11 is different from the DMAC 2 incorporated in the ROM data verification circuits according to the first and second embodiments shown in FIGS. 1 and 2. The DMAC 2 in the first and second embodiment is capable of designating addresses for data stored in the ROM 1 and capable of designating addresses the plurality of the output ports 4. On the other hand, the simple DMAC 10 in the ROM data verification circuit as the third embodiment only indicates the addresses of data stored in the ROM 1 and reads out the data from the ROM 1. In addition, the simple DMAC 11 only indicates the addresses of the output ports 4 and outputs the data to the output ports 4. Because of the above reason, through the description for the third embodiment, the DMAC 10 and 11 will be referred to as the simple DMAC, respectively. In FIG. 3, the reference number 12 designates a register as a buffer to temporarily store the data read from the ROM 1. The reference number 13 denotes a DMAC synchronous circuit 13 for controlling the synchronous operation between the simple DMAC 10 and the simple DMAC 11. That is, this register 12 is used in order to adjust a timing difference of the operation between the simple DMAC 10 and the simple DMAC 11 under the control of the DMAC synchronous circuit 13. Other components in the ROM data verification circuit of the third embodiment shown in FIG. 3 are the same of those components in the ROM data verification circuit as the first embodiment shown in FIG. 1, and the same reference numbers are used for the same components, and the explanation of them is therefore omitted here for brevity.

Next, a description will be given of the operation of the ROM data verification circuit of the third embodiment.

When the test (as data verification test) to check whether data have correctly been written into the ROM 1 is performed by comparing the data read out from the ROM 1 with expected values that have previously been prepared, first, the simple DMAC 10 outputs the address for data to be read stored in the ROM 1. Next, the under of the control of the DMAC synchronous circuit 13, both the simple DMAC 10 and the simple DMAC 11 operate simultaneously, and the simple DMAC 10 outputs the data read from the ROM 1 to the register 12. The register 12 stores the data temporarily. Then, the simple DMAC 11 outputs addresses indicating the plurality of output ports 4 through the address bus 6 and then outputs the data stored in the register 12 into the output ports 4 through the data bus 6 according to the designated addresses.

As described above, according to the third embodiment, like the ROM data verification circuits as first and second embodiments, it is possible to read a plurality of bytes from the ROM 1 simultaneously, and to compare the data read with the expected values, so that it is possible to perform the test operation at a high speed rate and to reduce the size of the test program. In addition to the features, because the simple DMAC 10 and the simple DMAC 11 has a simple configuration when comparing with the DMAC 2 to be used in the first and second embodiments, it is possible to reduce a layout area of the ROM data verification circuit as the third embodiment in a semiconductor integrated circuit on which the ROM data verification circuit is formed.

Fourth embodiment

Figure 4:
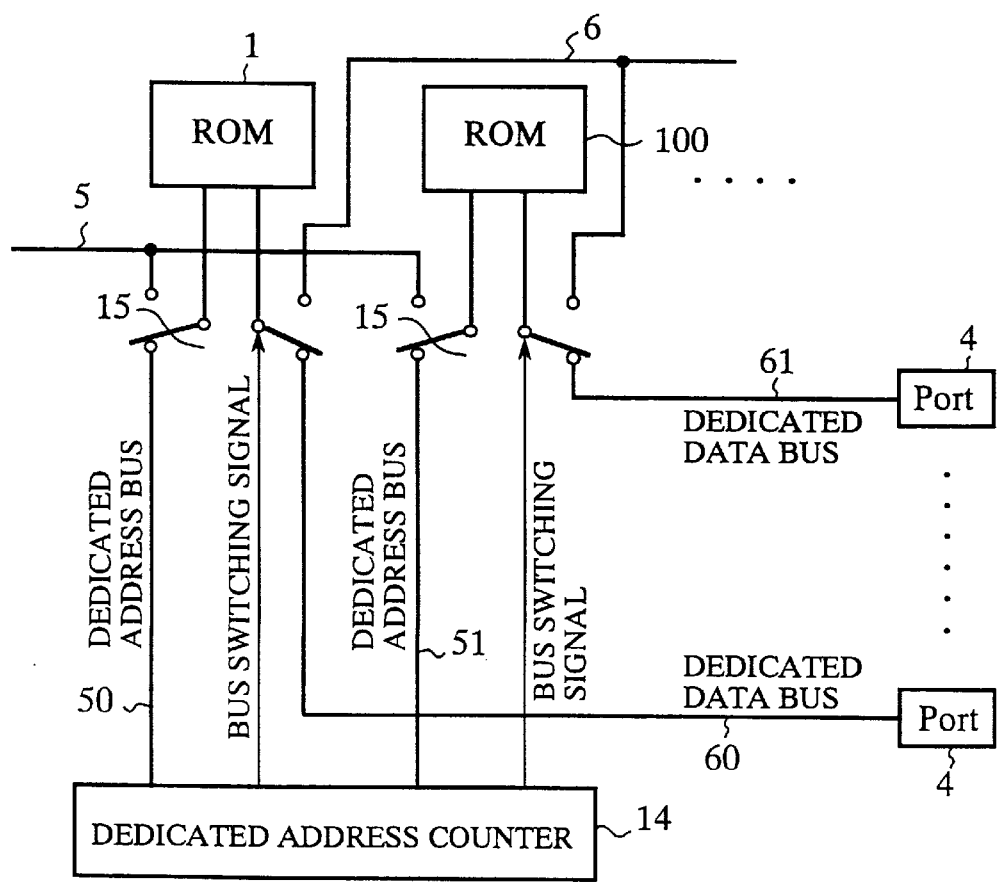
FIG. 4 is a block diagram showing a configuration of the ROM data verification circuit as the fourth embodiment according to the present invention.

FIG. 4 is a block diagram showing a configuration of the ROM data verification circuit as the fourth embodiment according to the present invention. In FIG. 4, each of the reference numbers 1 and 100 designates a ROM, each of the reference numbers 50 and 51 denotes a dedicated address bus corresponding to each of the ROM 1 and the ROM 100, respectively and each of the reference numbers 60 and 61 indicates a dedicated data bus corresponding to each of the ROM 1 and the ROM 100, respectively. The reference number 14 designates a dedicated address counter as control means for selecting one of the dedicated address buses 50 and 51. The reference number 15 designates bus switches, each bus switch 15 switches the connection of the ROM 1 and the ROM 100 from the general purpose address bus 5 and the general purpose data bus 6 to the dedicates address buses 50 and 51 and the dedicated data buses 60 and 61. Each ROM 1, 100 is connected to each output port 4 through the dedicated data bus 60, 61 one to one correspondence. Other components in the ROM data verification circuit of the fourth embodiment shown in FIG. 4 are the same of those components in the ROM data verification circuit as the first embodiment shown in FIG. 1, and the same reference numbers are used for the same components, and the explanation of them is therefore omitted here for brevity.

Next, a description will be given of the operation of the ROM data verification circuit of the fourth embodiment.

When the test (as data verification test) to check whether data have correctly been written into the ROM 1 and the ROM 100 is performed by comparing the data read out from the ROM 1 and the ROM 100 with expected values that have previously been prepared, first, the dedicated address counter 14 outputs a bus switching signal to the switches 15 in order to disconnect the general purpose bus 6 to the output ports 4 and to connect the dedicates data buses 60 and 61 to the output ports 4. That is, since the ROM 1 and the ROM 100 are connected to the output ports in one to one correspondence through the dedicated data buses 60 and 61, the dedicated address counter 14 outputs the bus switching signal to the switches 15 and thereby each of the ROM 1 and the ROM 100 is connected to each output port 4 through the correspondence dedicated data bus 60, 61. Then, the dedicated address counter 14 outputs the addresses to the ROM 1 and the ROM 100 and reads the data stored in the ROM 1 and the ROM 100 designated by the addresses and transfers the data to the output ports 4 through the dedicated data buses 60 and 61.

As described above, according to the fourth embodiment, since the ROM data verification circuit incorporates the switches 15, and the dedicates address buses 50 and 51 and the dedicates data buses 60 and 61 corresponding to the ROM 1 and the ROM 100, it is possible to read out data stored in the plurality of ROM devices 1 and 100 and to simultaneously output the data to the output ports 4 through the corresponding dedicated data buses 60 and 61. Therefore, it is possible to perform the test operation at a high speed rate and to reduce the size of the test program. In addition to the above features, because the ROM data verification circuit as the fourth embodiment does not require any DMAC 2 that is incorporated in the first and second embodiments, it is possible to form the ROM data verification circuit with a simple configuration when comparing with the ROM data verification circuit including the DMAC 2 according to the first and second embodiments, and it is also possible to reduce a layout area of the ROM data verification circuit in a semiconductor integrated circuit on which the ROM data verification circuit as the fourth embodiment is formed.

Fifth embodiment

Figure 5:
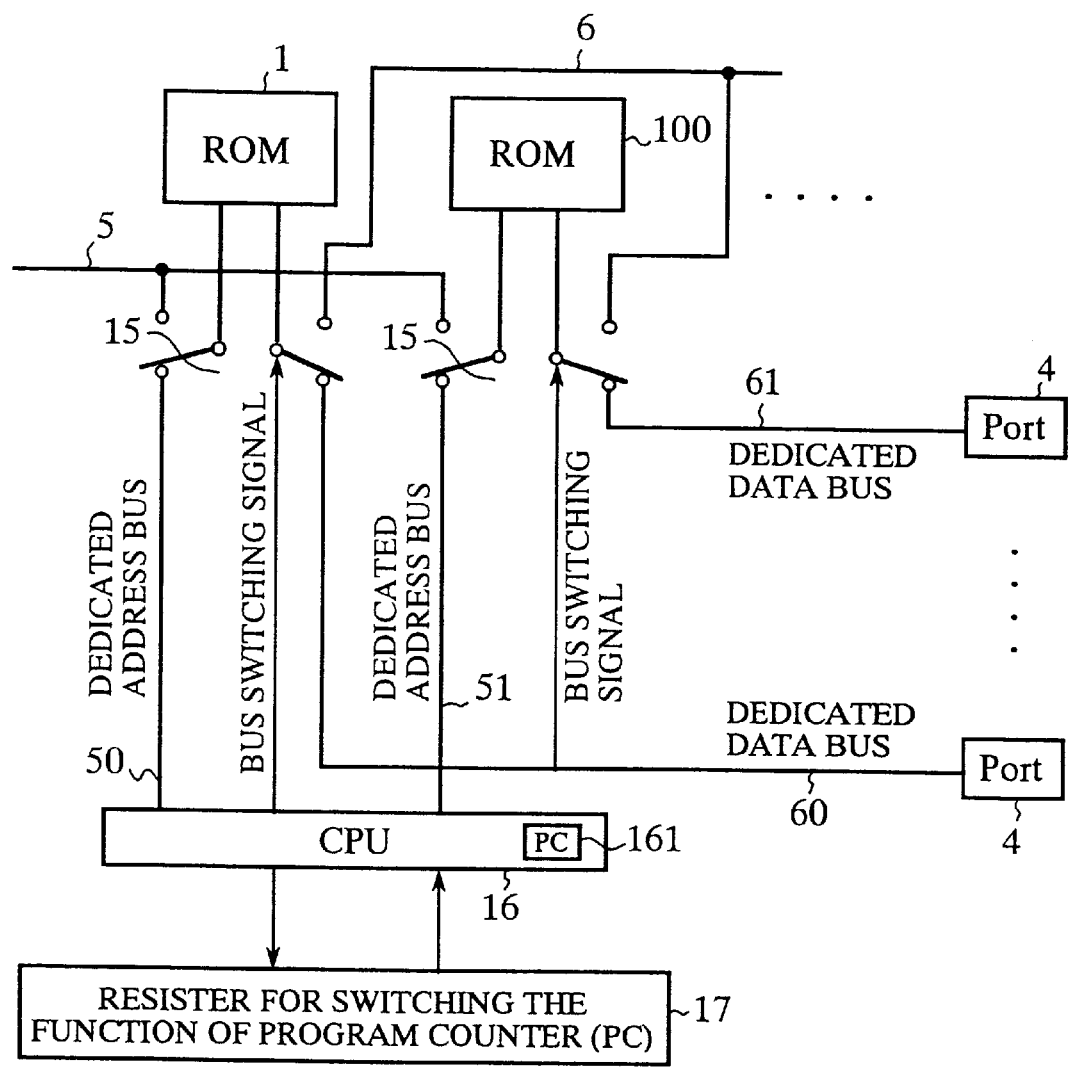
FIG. 5 is a block diagram showing a configuration of the ROM data verification circuit as the fifth embodiment according to the present invention.

FIG. 5 is a block diagram showing a configuration of the ROM data verification circuit as the fifth embodiment according to the present invention. In FIG. 5, the reference number 16 designates a central processing unit such as a CPU as a control means. A program counter 161 in the CPU 16 is used as a dedicated address counter for designating the addresses of data stored in the ROM 1 and the ROM 100. In addition, the CPU 16 generates and outputs the bus switching signal to the switches 15, like the dedicated address counter 14 to be incorporated in the ROM data verification circuit as the fourth embodiment. In FIG. 5, the reference number 17 denotes a register for switching the function of the program counter 161 in the CPU 16. The register 17 inputs a mode signal transferred from an external device (omitted from FIG. 5) and outputs a control signal to the CPU 16 so that the PC 161 is used as the address counter. Other components in the ROM data verification circuit as the fifth embodiment shown in FIG. 5 are the same of those of the ROM data verification circuit as the fourth embodiment shown in FIG. 4, and the same reference numbers are used for the same components, and the explanation of them is therefore omitted here for brevity.

Next, a description will be given of the operation of the ROM data verification circuit of the fifth embodiment.

When the test (as data verification test) to check whether data have correctly been written into the ROM 1 and the ROM 100 is performed by comparing the data read out from the ROM 1 and the ROM 100 with expected values that have previously been prepared, first, the CPU 16 executes a test program (not shown). Thereby, the CPU 16 writes a control signal into the register 17 so that the PC 161 in the CPU 16 acts the address counter like the dedicated address counter 14 in the fourth embodiment. Following operation is the same of the operation of the ROM data verification circuit as the fourth embodiment shown in FIG. 4, the explanation of the following operation is therefore omitted here.

As described above, according to the fifth embodiment, because the CPU 16 including the PC 161 and the register 17 are used instead of the dedicated address counter incorporated in the ROM data verification circuit as the fourth embodiment, and because the data are simultaneously read out from the ROM 1 and the ROM 100, simultaneously outputted to the corresponding output ports 4, and the data are simultaneously compared with expected values by external devices (not shown), therefore, it is possible to perform the test operation at a high speed rate and to reduce the size of the test program. In addition to the above features, like the fourth embodiment, because the ROM data verification circuit as the fifth embodiment does not require any DMAC 2 that is incorporated in the ROM data verification circuits as the first and second embodiments, it is possible to form the ROM data verification circuit with a simple configuration when comparing with the ROM data verification circuit including the DMAC 2 according to the first and second embodiments, and it is also possible to reduce a layout area of the ROM data verification circuit in a semiconductor integrated circuit on which the ROM data verification circuit as the fourth embodiment is formed.

Sixth embodiment

Figure 6:
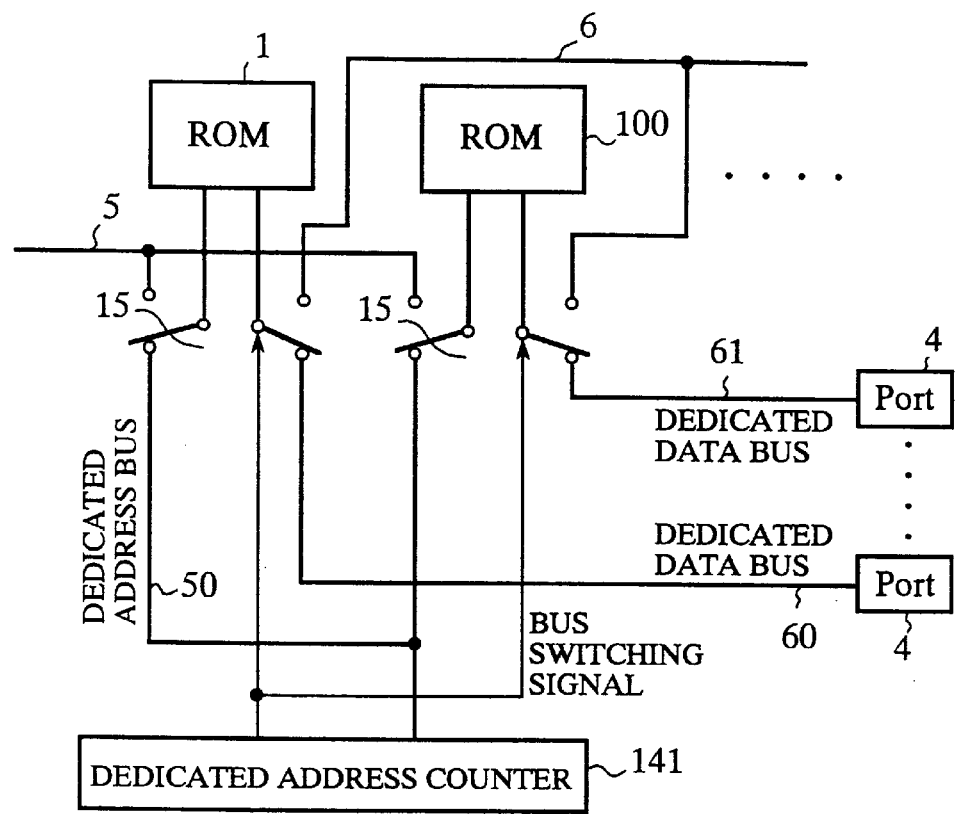
FIG. 6 is a block diagram showing a configuration of the ROM data verification circuit as the sixth embodiment according to the present invention.

FIG. 6 is a block diagram showing a configuration of the ROM data verification circuit as the sixth embodiment according to the present invention. In FIG. 6, the reference number 141 designates a dedicated address counter as a control means for generating addresses to be transferred simultaneously to both the ROM 1 and the ROM 100 through the switches 15 and the dedicated address bus 50. Accordingly, when comparing with the configuration of the fourth embodiment shown in FIG. 4, The ROM data verification circuit as the sixth embodiment requires only one dedicated address bus, not requires both the dedicated address buses 50 and 51. Other components other than the dedicated address counter 141 and the dedicated address bus 50 in the ROM data verification circuit as the sixth embodiment shown in FIG. 6 are the same of those components of the ROM data verification circuit as the fourth embodiment shown in FIG. 4, and the same reference numbers are used for the same components, and the explanation of them is therefore omitted here for brevity.

Next, a description will be given of the operation of the ROM data verification circuit of the sixth embodiment.

When the test (as data verification test) to check whether data have correctly been written into the ROM 1 and the ROM 100 is performed by comparing the data read out from the ROM 1 and the ROM 100 with expected values that have previously been prepared, first, the dedicated address counter 141 generates addressed and transfers the generated addresses to the ROM 1 and the ROM 100 simultaneously. Following operation of the ROM data verification circuit are the same of the operation in the fourth embodiment, the explanation of the following operation is therefore omitted here.

As described above, according to the sixth embodiment, since the ROM data verification circuit incorporates the dedicated address counter 141 and only the dedicated address bus 50 and generates addresses and outputs the generated addresses to ROM 1 and the ROM 100 simultaneously, it is thereby possible to access the data stored in the ROM 1 and the ROM 100 simultaneously and to output the data to the output ports 4, in addition to the effect of the fourth embodiment.

Seventh embodiment

Figure 7:
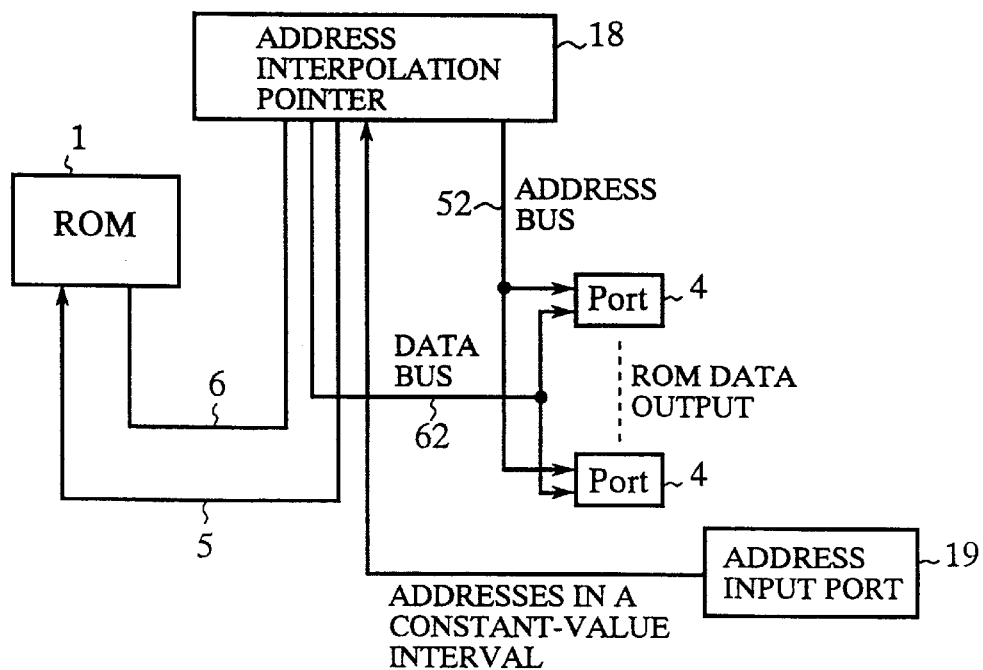
FIG. 7 is a block diagram showing a configuration of the ROM data verification circuit as the seventh embodiment according to the present invention.

FIG. 7 is a block diagram showing a configuration of the ROM data verification circuit as the seventh embodiment according to the present invention. In FIG. 7, the reference number 18 designates an address interpolation pointer for generating and outputting addresses to indicate data stored in the ROM 1 and the plurality of output ports 4, and the reference number 19 denotes an address input port for inputting addresses at constant intervals transferred from an external device such as an external tester and for outputting the address to the address interpolation pointer 18. When the address interpolation pointer 18 inputs the address from the address input port 19, the address interpolation pointer 18 counts up the address and generates addresses to indicate data stored in the ROM 1. The reference number 52 indicates address buses through which the addresses from the address interpolation pointer 18 to indicate the output ports 4 are transferred to the output ports 4. The reference number 62 indicates data buses. Through each of the data buses 62, the data read out from the ROM 1 are transferred to corresponding output port 4 per predetermined bit-width, for example per 4-bit data item. Other components in the ROM data verification circuit of the seventh embodiment shown in FIG. 7 are the same of those components in the ROM data verification circuit as the first embodiment shown in FIG. 1, and the same reference numbers are used for the same components, and the explanation of them is therefore omitted here for brevity.

Next, a description will be given of the operation of the ROM data verification circuit as the seventh embodiment.

When the test (as data verification test) to check whether data have correctly been written into the ROM 1 is performed by comparing the data read out from the ROM 1 with expected values that have previously been prepared, first, the address input port 19 inputs an address transferred from an external device such as an external tester and transfers the initial address into the address interpolation pointer 18. Next, the address interpolation pointer 18 receives and then counts up the address transferred from the address input port 19 in order to generate addresses indicating data in the ROM 1, and sends the generated addresses to the ROM 1. Thereby, data designated by the addresses transferred from the address interpolation pointer 18 are read out from the ROM 1. Then, the address interpolation pointer 18 divides the data read from the ROM 1 into a plurality of 4-bit data items, for example, and sends the addresses to indicate the output ports 4, and transfers each 4-bit data item to the corresponding output port 4. Following operation of the ROM data verification circuit as the seventh embodiment is the same of the operation in the first embodiment, the explanation of the following operation is therefore omitted here.

As described above, according to the seventh embodiment, since the ROM data verification circuit incorporates the address interpolation pointer 18, the address input port 19, the address bus 52, and the data bus 62, and since the address interpolation pointer 18 inputs addresses at constant address intervals transferred from the address input port 19 and generates addresses to indicate the data stored in the ROM 1 by counting up the address received through the address input port 19, and further outputs the addresses to indicate the plurality of output ports 4, it is therefore possible to output data stored in the ROM 1 to the plurality of output ports 4 simultaneously at a high speed rate, and it is not required to incorporate any CPU to execute a test program.

Eighth embodiment

Figure 8:
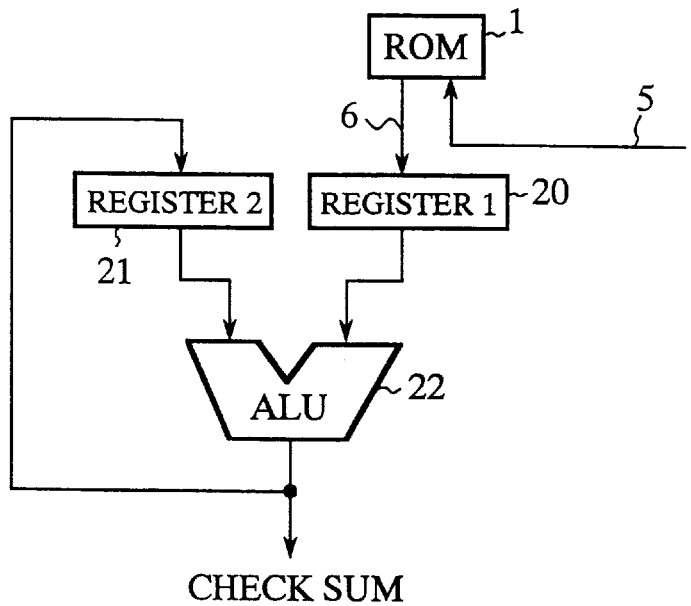
FIG. 8 is a block diagram showing a configuration of the ROM data verification circuit as the eighth embodiment according to the present invention.
Figure 9:
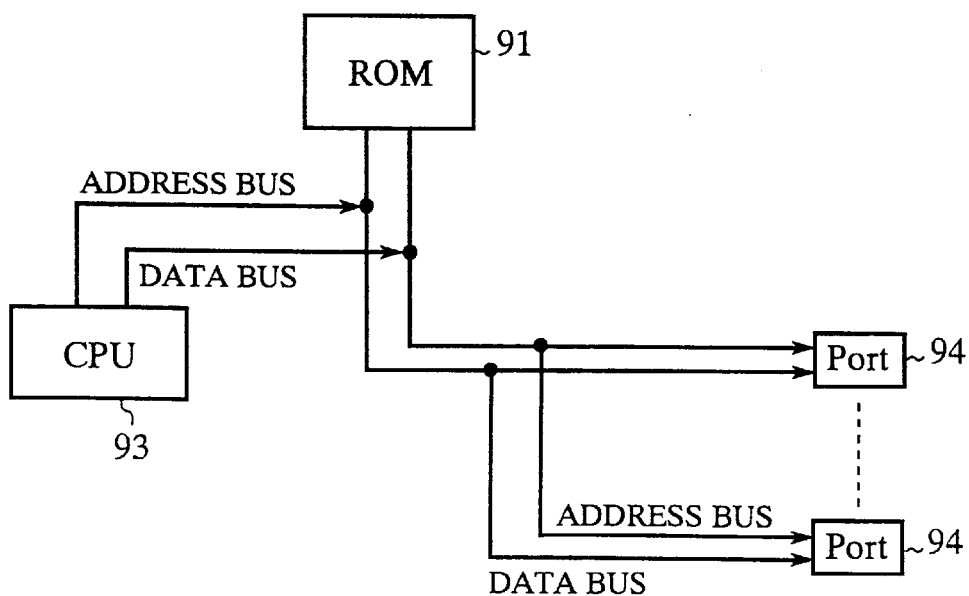
FIG. 9 is a block diagram showing a configuration of a conventional ROM data verification circuit.

FIG. 8 is a block diagram showing a configuration of the ROM data verification circuit as the eighth embodiment according to the present invention. In FIG. 8, the reference numbers 20 and 21 designate registers (register 1 and register 2). The reference number 22 indicates an arithmetic logic unit (ALU) for calculating data read from the ROM 1 in order to generate a check sum about the data. It is acceptable to use registers and ALU incorporated in the CPU 3 in the first embodiment shown in FIG. 1 instead of the registers 20 and 21 and the ALU 22 shown in FIG. 8. Other components in the ROM data verification circuit of the eighth embodiment shown in FIG. 8 are the same of those components of the ROM data verification circuit as the first embodiment shown in FIG. 1, and the same reference numbers are used for the same components, and the explanation of them is therefore omitted here for brevity.

Next, a description will be given of the operation of the ROM data verification circuit as the eighth embodiment.

When the test (as data verification test) to check whether data have correctly been written into the ROM 1 is performed by comparing the data read out from the ROM 1 with expected values that have previously been prepared, first, the address to indicate the data stored in the ROM 1 is transferred to the ROM 1 inputted through the address bus 5. Thereby, the data read from the ROM 1 are stored into the register 20. Next, the ALU 22 operates an arithmetic operation to generate a check sum between the data stored in the register 20 and the data that have been previously read from the ROM 1 and stored in the register 21. The result of the arithmetic operation by the ALU 22 is outputted externally and also stored into the register 21. Instructions, to execute the arithmetic operation to generate the check sum, are stored in micro codes as a micro instruction group corresponding to one instruction to be executed by a microprocessor. Therefore, it is possible to reduce the size of a ROM data verification program to verify the data stored in the ROM 1 by incorporating those instructions into an information processing system.

As described above, according to the eighth embodiment, the arithmetic operation to generate a check sum of the data read out from the ROM 1 is performed by using the register 20, the register 21, and the ALU 22, so that the verification for the data stored in the ROM 1 can be simple performed at a high speed rate. In addition, the instructions executing the arithmetic operation to generate the check sum are stored as micro codes into an information processing system, it is possible to reduce the size of the source codes of the test program for the ROM data verification operation and also to reduce the execution time of the test operation. Further, because it is possible to check the data read out from the ROM 1 by using the ALU 22 in the ROM data verification circuit as the eighth embodiment without using any expensive external tester. Further, it is possible to simultaneously perform the test operation for a plurality of semiconductor chips, each incorporating the ROM data verification circuit. Moreover, it is thereby possible to reduce the time required for the test operation and to reduce the cost of the semiconductor chips.

As set forth in detail, according to the present invention, the ROM data verification circuit has the configuration in which: control means directly reads out data stored in the ROM when a CPU abandons to use an address bus and a data bus, divides the data that have been read out from the ROM into a plurality of divided data, and generates a plurality of addresses according to which the plurality of divided data are transferred, and a plurality of output ports indicated by the addresses generated by and transferred from the control means output the plurality of divided data externally. Therefore it is possible to precisely execute the data verification operation (or data test operation) for the data stored in the ROM at a high speed rate and to reduce the size of a test program to execute the data verification operation.

In addition, according to the present invention, the ROM data verification circuit has the configuration in which a first register to which control data indicating to abandon the use of the address bus and the data bus by the CPU are set is further incorporated. Further, in the ROM data verification circuit, the control means is a Direct Memory Access Controller, and the DMAC commences to directly read the data stored in the ROM when the control data are stored into the first register. Therefore it is also possible to precisely execute the data verification operation (or data test operation) for the data stored in the ROM at a high speed rate and to reduce the size of a test program to execute the data verification operation.

Furthermore, according to the present invention, the ROM data verification circuit has the configuration in which an address pointer for generating addresses corresponding to the plurality of output ports is further incorporated. In the ROM data verification circuit, the control means is a Direct Memory Access Controller, and the divided data outputted from the DAMC are transferred to each of the plurality of output ports designated by the corresponding address generated by the address pointer. Thereby, addresses for the output ports are generated by counting up the initial address value when an initial address value is set into the address pointer. It is therefore possible to execute the data verification operation (or data test operation) for the data stored in the ROM precisely at a high speed rate and to reduce the size of a test program to execute the data verification operation.

Moreover, according to the present invention, the ROM data verification circuit, the ROM data verification circuit has the configuration in which the control means comprises a first control means, a second control means, a second register placed between the first control means and the second control means, and a Direct Memory Access Controller (DMAC) synchronous circuit. In the ROM data verification circuit, operation of both the first control means and the second control means is synchronized under the control of the DMAC synchronous circuit, the first control means reads out the data stored in the ROM and stores the data into the second register, and the second control means reads and then divides the data stored in the second register into a plurality of divided data and generates addresses to indicate the plurality of output ports and outputs the plurality of divided data to the plurality of output ports indicated by the addresses generated by the second control means. It is therefore possible to execute the data verification operation (or data test operation) for the data stored in the ROM precisely at a high speed rate execute the data verification operation (or data test operation) for the data stored in the ROM precisely at a high speed rate and to reduce the size of a test program to execute the data verification operation. In addition, because two DMACs as the first control means and a second control means has a simple configuration when comparing with the configuration of the DMAC described above, it is possible to reduce a layout area of a semiconductor integrated chip on which the ROM data verification circuit is formed.

In addition, according to the present invention, the ROM data verification circuit has the configuration in which the control means is a dedicated address counter, and the ROM comprises a plurality of ROM devices, and the ROM data verification circuit further comprises dedicated address buses and dedicated data buses, placed corresponding to the output ports, through which the data read from the plurality of ROM devices are transferred to the plurality of output ports, and the dedicated address counter generates the addresses to indicate the data stored in the plurality of ROM devices and outputs the addresses to the ROM devices through the dedicated address buses, and reads the data from the plurality of ROM devices and then transfers the data that have been read out into the plurality of corresponding output ports. It is therefore possible to output the divided data into the plurality of output ports simultaneously.

Furthermore, according to the present invention, the ROM data verification circuit has the configuration in which the ROM comprises a plurality of ROM devices, the control means is a Central Processing Unit including a program counter, and the ROM data verification circuit further comprises dedicated address buses and dedicated data buses, placed corresponding to the plurality of output ports, through which the data read from the plurality of ROM devices are transferred to the plurality of output ports, and the program counter in the CPU generates addressed to indicate the data stored in the plurality of ROM devices, outputs the addresses to the plurality of ROM devices through the dedicated address buses and reads the data and outputs the data that have been read out to the plurality of corresponding output ports through the dedicated data buses. It is therefore possible to preciously perform the data test operation for the data that have been written in and stored in the ROM at a high speed rate and to reduce the size of the test program.

Moreover, according to the ROM data verification circuit, the ROM data verification circuit has the configuration in which the dedicated address counter simultaneously generates a plurality of addresses to indicate data stored in the plurality of ROM devices, and simultaneously reads the data from the plurality of ROM devices by using the plurality of addresses generated, and outputs the data to the plurality of corresponding output ports through the dedicated data buses. It is therefore possible to preciously perform the data test operation for the data written in and stored in the ROM at a high speed rate and to reduce the size of the test program.

In addition, according to the present invention, the ROM data verification circuit has the configuration in which the control means is an address interpolation pointer for generating addresses to indicate data stored in the ROM, and when inputting an address to indicate the data stored in the ROM, the address interpolation pointer sequentially generates addresses to indicate the data stored in the ROM, transfers the addresses generated to the ROM, reads the data from the ROM, and then outputs the data that have been read out to the plurality of output ports. It is not required to incorporate any CUP to generate addresses in a semiconductor integrated chip, and it is possible to generate the addresses at a high speed rate, to suppress the amount of control data such as addresses supplied from external devices such as an external tester, and to access and output the data stored in the ROM externally at a high speed rate.

Furthermore, according to the present invention, because the ROM data verification circuit includes a first register for storing data read out from a ROM by using designated addresses, a second register for storing data that have been read out from the ROM in a previous readout operation, and an Arithmetic Logic Unit for performing the arithmetic operation between the data stored in both the first register and the second register and generates a check sum between these data, it is not required to use any expensive external tester, to perform the data test operation for data stored in each ROM in each semiconductor integrated chip simultaneously at a high speed rate. It is therefore possible to reduce the cost required for the data test operation.

Furthermore, in the ROM data verification circuit described above according to the present invention, because the ROM data verification circuit includes instructions as micro codes, the instructions include an instruction to access both the first register, the second register, and the Arithmetic Logic Unit, and to generate the check sum between the data stored in both the first register and the second register by executing the Arithmetic Logic Unit, it is not required to use any expensive external tester, to perform the data test operation for data stored in each ROM in each semiconductor integrated chip simultaneously at a high speed rate, and therefore possible to reduce the cost required for the data test operation for the data stored in each ROM.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A ROM data verification circuit to be used for checking data stored in a ROM, comprising:

control means for directly reading out data stored in said ROM when a CPU abandons to use an address bus and a data bus, for dividing the data that have been read out from said ROM into a plurality of divided data, and for generating a plurality of addresses according to which the plurality of divided data are transferred; and a plurality of output ports indicated by the addresses generated by and transferred from said control means to which the plurality of divided data are transferred by said control means according to the addresses.

2. A ROM data verification circuit as claimed in claim 1, further comprises a first register to which control data indicating to abandon the use of said address bus and said the data bus by said CPU are set, wherein said control means is a Direct Memory Access Controller (DMAC), and said DMAC commences to read the data stored in said ROM when the control data are stored into the first register.

3. A ROM data verification circuit as claimed in claim 1, further comprises an address pointer for generating addresses corresponding to said plurality of output ports, wherein said control means is a Direct Memory Access Controller (DMAC), and the divided data outputted from said DMAC are transferred to each of said plurality of output ports designated by the corresponding address generated by said address pointer.

4. A ROM data verification circuit as claimed in claim 1, wherein said control means comprises:

first control means;

second control means;

a second register placed between said first control means and said second control means; and a Direct Memory Access Controller (DMAC) synchronous circuit, and wherein under control of said DMAC synchronous circuit, operation of both said first control means and said second control means is synchronized, said first control means reads out the data stored in said ROM and stores the data into said second register, and said second control means reads and then divides the data stored in said second register into a plurality of divided data and generates addresses to indicate said plurality of output ports and outputs the plurality of divided data to said plurality of output ports indicated by the addresses generated by said second control means.

5. A ROM data verification circuit as claimed in claim 1, wherein said control means is a dedicated address counter, and said ROM comprises a plurality of ROM devices, and said ROM data verification circuit further comprises dedicated address buses and dedicated data buses, placed corresponding to said output ports, through which the data read from said plurality of ROM devices are transferred to said plurality of output ports, and wherein said dedicated address counter generates the addresses to indicate the data stored in said plurality of ROM devices and outputs the addresses to said ROM devices through said dedicated address buses, and reads the data from said plurality of ROM devices and then transfers the data that have been read out into said plurality of corresponding output ports.

6. A ROM data verification circuit as claimed in claim 1, wherein said ROM comprises a plurality of ROM devices, said control means is a Central Processing Unit including a program counter, and said ROM data verification circuit further comprises dedicated address buses and dedicated data buses, placed corresponding to said plurality of output ports, through which the data read from said plurality of ROM devices are transferred to said plurality of output ports, and wherein said program counter in said CPU generates addressed to indicate the data stored in said plurality of ROM devices, outputs the addresses to said plurality of ROM devices through said dedicated address buses and reads the data and outputs the data that have been read out to said plurality of output ports through said dedicated data buses.

7. A ROM data verification circuit as claimed in claim 5, wherein said dedicated address counter simultaneously generates a plurality of addresses to indicate data stored in said plurality of ROM devices, and simultaneously reads the data from said plurality of ROM devices by using the plurality of addresses generated, and outputs the data to said plurality of corresponding output ports through said dedicated data buses.

8. A ROM data verification circuit as claimed in claim 1, wherein said control means is an address interpolation pointer for generating addresses to indicate data stored in said ROM, wherein when inputting an address to indicate the data stored in said ROM, said address interpolation pointer sequentially generates addresses to indicate the data stored in said ROM, transfers the addresses generated to said ROM, reads the data from said ROM, and then outputs the data that have been read out to said plurality of output ports.

9. A ROM data verification circuit comprises:
   a first register for storing data read out from a ROM by using designated addresses;
   a second register for storing data that have been read out from said ROM in a previous readout operation; and
   an Arithmetic Logic Unit for performing an arithmetic operation between the data stored in both the first register and the second register and generates a check sum between the data.

10. A ROM data verification circuit as claimed in claim 9, includes instructions as micro codes, wherein said instructions include an instruction to access both said register, said second register, and said Arithmetic Logic unit, and to generate the check sum between the data stored in both said first register and said the second register by executing said Arithmetic Logic Unit.

* * * * *